(12) United States Patent
Tang et al.

(10) Patent No.: US 12,738,922 B2
(45) Date of Patent: Sep. 15, 2026

(54) ACOUSTIC WAVE RESONATOR WITH REDUCED SIZE

(71) Applicant: SKYWORKS SOLUTIONS, INC., Irvine, CA (US)

(72) Inventors: Gong Bin Tang, Moriguchi (JP); Rei Goto, Osaka (JP); Hironori Fukuhara, Ibaraki (JP); Keiichi Maki, Suita (JP); Hiroyuki Nakamura, Osaka-Fu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 1091 days.

(21) Appl. No.: 17/813,986

(22) Filed: Jul. 21, 2022

(65) Prior Publication Data

US 2023/0031568 A1 Feb. 2, 2023

Related U.S. Application Data

(60) Provisional application No. 63/226,324, filed on Jul. 28, 2021.

(51) Int. Cl.
*H03H 9/02* (2006.01)
*H03H 3/08* (2006.01)
(Continued)

(52) U.S. Cl.
CPC ................ *H03H 9/25* (2013.01); *H03H 3/08* (2013.01); *H03H 9/02574* (2013.01);
(Continued)

(58) Field of Classification Search
CPC .. H03H 9/25; H03H 9/02574; H03H 9/02685; H03H 9/02992
(Continued)

(56) References Cited

U.S. PATENT DOCUMENTS

2009/0267707 A1* 10/2009 Miura .................. H03H 9/1457 310/313 C
2019/0288667 A1* 9/2019 Hayashi ............. H03H 9/02574
(Continued)

OTHER PUBLICATIONS

Namdeo et al., "Simulation on Effects of Electrical Loading due to Interdigital Transducers in Surface Acoustic Wave Resonator," Procedia Engineering 64 (2013), pp. 322-330.

*Primary Examiner* — Derek J Rosenau
(74) *Attorney, Agent, or Firm* — Lando & Anastasi, LLP

(57) ABSTRACT

An acoustic wave resonator comprises a carrier substrate, a layer of dielectric material disposed on an upper surface of the carrier substrate, and a layer of piezoelectric material disposed above the layer of dielectric material. The layer of piezoelectric material includes a pair of opposing terminating edges that are coterminous with the layer of dielectric material. One or more interdigital transducers (IDTs) are disposed on the layer of piezoelectric material. The opposing terminating edges sandwich the one or more interdigital transducers, and in some examples, a pair of reflector gratings disposed on the layer of piezoelectric material and each including less than eight reflector fingers. The opposing terminating edges provide edge reflections that allow a reduction in size or a complete removal of the reflector gratings, resulting in a smaller acoustic wave resonator compared to conventional devices while maintaining a comparable performance.

20 Claims, 12 Drawing Sheets

(51) Int. Cl.
*H03H 9/145* (2006.01)
*H03H 9/25* (2006.01)

(52) U.S. Cl.
CPC .... *H03H 9/02685* (2013.01); *H03H 9/02992* (2013.01); *H03H 9/145* (2013.01)

(58) Field of Classification Search
USPC ...... 310/313 R, 313 A, 313 B, 313 C, 313 D
See application file for complete search history.

(56) References Cited

U.S. PATENT DOCUMENTS

2021/0058057 A1 2/2021 Goto et al.
2021/0067136 A1 3/2021 Fujiwara et al.
2021/0104999 A1* 4/2021 Geshi .................... H10N 30/06
2021/0126624 A1 4/2021 Hiramatsu et al.
2021/0159886 A1 5/2021 Goto et al.

* cited by examiner 110
108
110
106

ACOUSTIC WAVE RESONATOR WITH REDUCED SIZE

CROSS-REFERENCE TO RELATED APPLICATIONS

This application claims priority under 35 U.S.C. § 119(e) to U.S. Provisional Patent Application Serial No. 63/226,324, titled "ACOUSTIC WAVE RESONATOR WITH REDUCED SIZE," filed Jul. 28, 2021, the entire contents of which is incorporated herein by reference in its entirety for all purposes.

BACKGROUND

Field

Aspects and embodiments disclosed herein relate to an acoustic wave resonator with reduced size, and a method of manufacture of the same.

DESCRIPTION OF THE RELATED TECHNOLOGY

Size reduction of acoustic wave devices such as surface acoustic wave (SAW) devices, for example SAW filters, duplexers and diplexers, is highly desirable for future smaller sized module developments. Present solutions for miniaturization of SAW components use combinations of low velocity substrates and heavy electrodes. However these solutions are dependent on specific material properties, and are therefore quite limited. A larger design freedom for future modules is needed.

FIGS. 1A and 1B show a cross-sectional view and a plan view, respectively, of an example of a conventional SAW resonator device. The SAW resonator 100 includes a carrier substrate 102, a layer of dielectric material 104 disposed on an upper surface of the carrier substrate 102, and a layer of piezoelectric material 106 disposed on the layer of dielectric material 104. An interdigital transducer (IDT) 108 and a pair of reflector gratings 110 are disposed on top of the layer of piezoelectric material 106, with each of the pair of reflector gratings 110 positioned on opposing sides of the IDT.

The conventional SAW resonator 100 of FIGS. 1A and 1B may typically have 10 to 15 or more reflector fingers in each of the reflector gratings 110, with each finger separated by a distance equal to half the wavelength of a surface acoustic wave generated by the IDT 108.

In more detail, FIGS. 1C and 1D are coupling of mode (COM) simulation graphs showing device characteristics of conventional SAW resonators such as that in FIGS. 1A and 1B. FIG. 1C shows the relationship between quality factor Q of the SAW resonator 100 and the number of reflector fingers in the reflector gratings 110 at various reflection coefficients (k12). Using thicker or higher density materials in the reflector gratings both lead to higher reflection coefficients. The acoustic energy being confined between the reflector gratings 100 occurs when the Q factor is high, at around 1200 in the graph of FIG. 1C. As can be seen from the graph of FIG. 1C, a particular number of reflector fingers is needed at a given reflection coefficient to achieve a sufficiently high Q value for the acoustic energy to be confined between the reflector gratings 110 to create a SAW resonator.

FIG. 1D is a graph showing the minimum number of reflector fingers required for reflector gratings 110 with different reflection coefficients in the conventional SAW resonator 100. In other words, FIG. 1D shows how many reflector fingers are needed at a given reflection coefficient for the Q factor to reach the appropriate level in FIG. 1C. As can be seen for FIG. 1D, at least eight reflector fingers are needed in each of the reflector gratings 110 no matter what value the reflection coefficient takes.

SUMMARY

According to one embodiment there is provided an acoustic wave resonator. The acoustic wave resonator comprises a carrier substrate, a layer of dielectric material disposed on an upper surface of the carrier substrate, a layer of piezoelectric material disposed above the layer of dielectric material on the upper surface of the carrier substrate, the layer of piezoelectric material including a pair of opposing terminating edges that are coterminous with the layer of dielectric material, and one or more interdigital transducers disposed on the layer of piezoelectric material, the one or more interdigital transducers being configured to generate an acoustic wave, the one or more interdigital transducers including a pair of opposing edge electrode fingers that extend perpendicular to the direction of propagation of the acoustic wave and that are each positioned adjacent to a respective terminating edge of the layer of piezoelectric material and layer of dielectric material.

In one example the opposing terminating edges are formed by etching or dicing the layer of dielectric material and the layer of piezoelectric material.

In one example the opposing terminating edges form a boundary between the layers of dielectric and piezoelectric materials and the ambient air.

In one example the acoustic wave resonator further comprises a material of high impedance disposed against the opposing terminating edges.

In one example the opposing terminating edges each extend parallel to the respective edge electrode fingers of the one or more interdigital transducers.

In one example the opposing terminating edges are configured to reflect the acoustic wave generated by the one or more interdigital transducers.

In one example the carrier substrate is also coterminous with the opposing terminating edges of the layers of dielectric and piezoelectric materials.

In one example the layer of piezoelectric material includes a second pair of opposing terminating edges that are coterminous with the layer of dielectric material.

In one example the second pair of opposing terminating edges are each positioned adjacent to a respective bus bar from opposing bus bars included in the one or more interdigital transducers that extend parallel to the direction of propagation of the acoustic wave generated by the one or more interdigital transducers.

In one example the spacing between each edge electrode finger and the adjacent respective terminating edge is equal to about $\lambda/8$, where $\lambda$ is the wavelength of the acoustic wave generated by the one or more interdigital transducers during operation.

In one example the layer of piezoelectric material and the layer of dielectric material each have a thickness of between about $0.1\lambda$ and about $1\lambda$, where $\lambda$ is the wavelength of the acoustic wave generated by the one or more interdigital transducers during operation.

In one example the layer of piezoelectric material is formed of a material selected from the group consisting of lithium tantalite, aluminum nitrate, lithium niobate, or potassium niobate. In one example the layer of dielectric material includes silicon dioxide, or doped silicon material.

In one example the carrier substrate is formed of a material selected from the group consisting of silicon, aluminum nitride, silicon nitride, magnesium oxide spinel, magnesium oxide crystal, quartz, diamond, diamond-like carbon, or sapphire.

According to another embodiment there is provided an acoustic wave resonator. The acoustic wave resonator comprises a carrier substrate, a layer of dielectric material disposed on an upper surface of the carrier substrate, a layer of piezoelectric material disposed above the layer of dielectric material on the upper surface of the carrier substrate, the layer of piezoelectric material including a pair of opposing terminating edges that are coterminous with the layer of dielectric material, one or more interdigital transducers disposed on the layer of piezoelectric material, and a pair of reflector gratings disposed on the layer of piezoelectric material and each including less than eight reflector fingers, the pair of reflector gratings each being positioned adjacent to a respective terminating edge of the layer of piezoelectric material and layer of dielectric material such that the reflector gratings oppose each other with the one or more interdigital transducers therebetween.

In one example the pair of reflector gratings each include a number of reflector fingers equal to or less than five.

In one example the opposing terminating edges are formed by etching or dicing the layer of dielectric material and the layer of piezoelectric material.

In one example the opposing terminating edges form a boundary between the layers of dielectric and piezoelectric materials and the ambient air.

In one example the acoustic wave resonator further comprises a material of high impedance disposed against the opposing terminating edges.

In one example the opposing terminating edges each extend parallel to an edge reflector finger of the respective reflector grating.

In one example the opposing terminating edges are configured to reflect an acoustic wave generated by the one or more interdigital transducers.

In one example the carrier substrate is also coterminous with the opposing terminating edges of the layers of dielectric and piezoelectric materials.

In one example the layer of piezoelectric material includes a second pair of opposing terminating edges that are coterminous with the layer of dielectric material.

In one example the second pair of opposing terminating edges are each positioned adjacent to a respective bus bar from opposing bus bars included in the one or more interdigital transducers that extend parallel to the direction of propagation of the acoustic wave generated by the one or more interdigital transducers.

In one example the spacing between an edge electrode finger of each reflector grating and the respective terminating edge is equal to about $\lambda/8$, where $\lambda$ is the wavelength of the acoustic wave generated by the one or more interdigital transducers during operation.

In one example the spacing between each reflector grating and an edge electrode finger of the one or more interdigital transducers is equal to about $\lambda/8$, where $\lambda$ is the wavelength of the acoustic wave generated by the one or more interdigital transducers during operation.

In one example the layer of piezoelectric material and the layer of dielectric material each have a thickness of between about $0.1\lambda$ and about $1\lambda$, $\lambda$ being the wavelength of the acoustic wave generated by the one or more interdigital transducers during operation.

In one example the layer of piezoelectric material is formed of a material selected from the group consisting of lithium tantalite, aluminum nitrate, lithium niobate, or potassium niobate.

In one example the layer of dielectric material includes silicon dioxide, or doped silicon material.

In one example the carrier substrate is formed of a material selected from the group consisting of silicon, aluminum nitride, silicon nitride, magnesium oxide spinel, magnesium oxide crystal, quartz, diamond, diamond-like carbon, or sapphire.

According to another embodiment there is provided a method of manufacturing an acoustic wave resonator. The method comprises providing a carrier substrate, disposing a layer of dielectric material on an upper surface of the carrier substrate, disposing a layer of piezoelectric material above the layer of dielectric material on the upper surface of the carrier substrate, disposing one or more interdigital transducers on the layer of piezoelectric material, and optionally disposing a pair of reflector gratings that oppose each other with the one or more interdigital transducers therebetween, each reflector grating including less than eight reflector fingers, and etching or dicing the layer of piezoelectric material and the layer of dielectric material to form a pair of opposing terminating edges that are each positioned either adjacent to respective edge electrode fingers included in the one or more interdigital transducers that extend perpendicular to the direction of propagation of an acoustic wave to be generated by the one or more interdigital transducers, or adjacent to a respective reflector grating.

Still other aspects, embodiments, and advantages of these exemplary aspects and embodiments are discussed in detail below. Embodiments disclosed herein may be combined with other embodiments in any manner consistent with at least one of the principles disclosed herein, and references to “an embodiment,” “some embodiments,” “an alternate embodiment,” “various embodiments,” “one embodiment” or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 5A is a method step of forming an acoustic wave resonator according to aspects of the present invention;

FIG. 5B is a method step of forming an acoustic wave resonator according to aspects of the present invention;

FIG. 5C is a method step of forming an acoustic wave resonator according to aspects of the present invention;

FIG. 5D is a method step of forming an acoustic wave resonator according to aspects of the present invention;

DETAILED DESCRIPTION

Aspects and embodiments described herein are directed to an acoustic wave resonator, and a method of manufacture of the same. In some examples, the acoustic wave resonator comprises a carrier substrate, a layer of dielectric material disposed on an upper surface of the carrier substrate, and a layer of piezoelectric material disposed above the layer of dielectric material on the upper surface of the carrier substrate. The layer of piezoelectric material includes a pair of opposing terminating edges that are coterminous with the layer of dielectric material. One or more interdigital transducers (IDTs) are disposed on the layer of piezoelectric material. The opposing terminating edges sandwich the one or more interdigital transducers, and in some examples, a pair of reflector gratings disposed on the layer of piezoelectric material, each pair of reflectors including less than eight reflector fingers. The opposing terminating edges provide edge reflections that allow a reduction in size or a complete removal of the reflector gratings, resulting in a smaller acoustic wave resonator compared to conventional devices while maintaining a comparable performance.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, or all of the described terms.

The invention is described below through embodiments of acoustic wave resonators, in particular surface acoustic wave (SAW) resonators. However, as would be understood by the skilled person, various different excitation modes are possible in acoustic wave resonators, filters, and devices, particularly multi-layer piezoelectric substrate (MPS) devices. In addition to surface acoustic waves other types of acoustic wave are possible such as boundary acoustic waves and guided acoustic waves. References to SAW resonators/devices in the following description are not intended to limit the disclosure from including or covering other possible types of acoustic waves and acoustic wave resonators/devices.

Figure 2A:
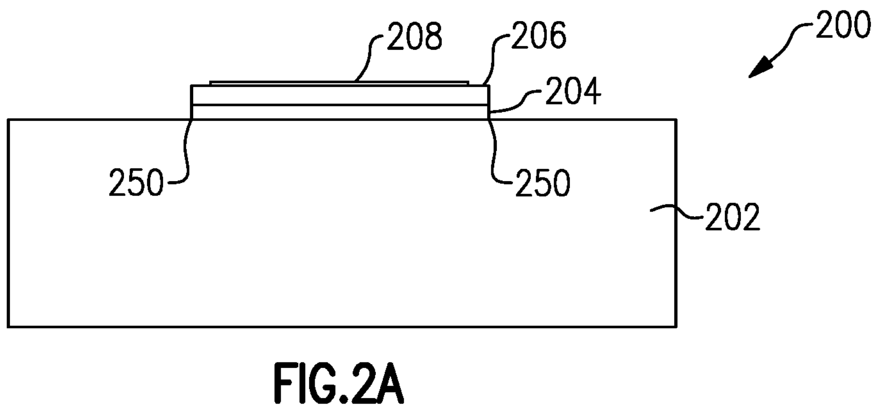
FIG. 2A is a cross-sectional view of an acoustic wave resonator according to aspects of the present invention.
Figure 2B:
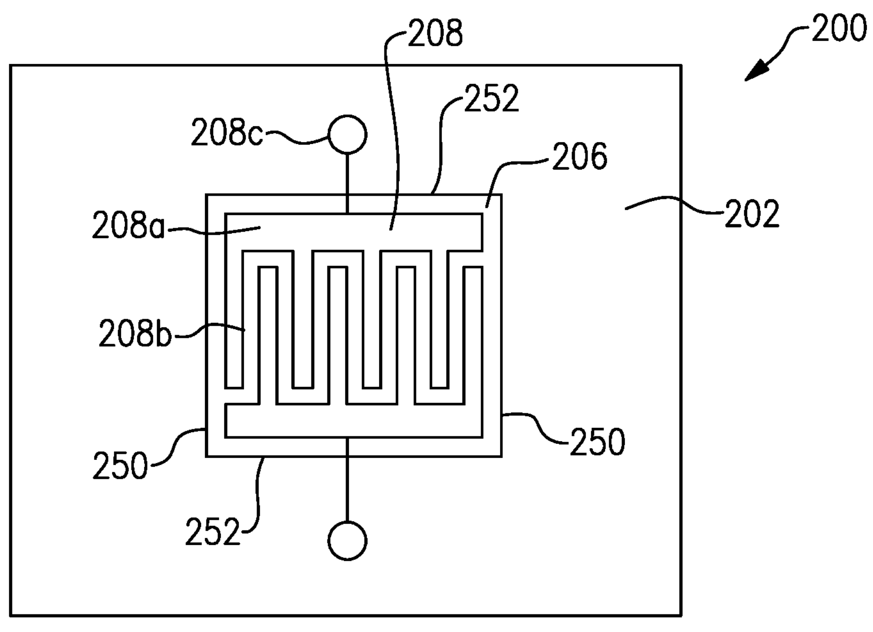
FIG. 2B is a plan view of an acoustic wave resonator according to aspects of the present invention.

FIGS. 2A and 2B show a cross-sectional view and a plan view respectively of a SAW resonator device of an embodiment of the present invention. The SAW resonator 200 includes a carrier substrate 202, a layer of dielectric material 204 disposed on an upper surface of the carrier substrate 202, and a layer of piezoelectric material 206 disposed above the layer of dielectric material 204 on the upper surface of the carrier substrate 202. Together the carrier substrate 202, layer of dielectric material 204, and layer of piezoelectric material 206 may be referred to as a multilayer piezoelectric substrate.

Any piezoelectric material may be used as the layer of piezoelectric material 206, for example, including but not limited to lithium tantalate ($LiTaO_3$), aluminum nitrite (AlN), lithium niobate ($LiNbO_3$), or potassium niobate ($KNbO_3$). Various materials may also be used in the layer of dielectric material 204 and in the carrier substrate 202. One example of a material that may be utilized for the layer of dielectric material 204 is silicon dioxide ($SiO_2$). Other examples may include doped materials such as F doped $SiO_2$, or Ti doped $SiO_2$. One example of a material that may be utilized for the carrier substrate 202 is silicon (Si), however aluminum nitride, silicon nitride, magnesium oxide spinel, magnesium oxide crystal, quartz, diamond, DLC (diamond-like carbon) and sapphire may all also be used as the carrier substrate.

In some embodiments, the carrier substrate 202 may be provided in the form of a silicon wafer that is bonded to the lower surface of a wafer of piezoelectric material opposite the upper surface of the wafer of piezoelectric material upon which features of SAW resonators, such as IDT electrodes, may be formed. The silicon may be bonded to the piezoelectric material via a thin layer of dielectric material (for example, the layer of dielectric material 204). In some embodiments, a layer of silicon dioxide may be grown or deposited on the lower surface of the piezoelectric material and a layer of silicon dioxide may be grown or deposited on the upper surface of the silicon material. The piezoelectric material and silicon may then be joined by anodic bonding or other methods of joining layers of silicon dioxide known in the art, to form the layer of dielectric material 204.

The carrier substrate 202 may be formed of a material having a lower coefficient of linear expansion and/or a higher thermal conductivity and/or a higher toughness or mechanical strength than the piezoelectric material. The carrier substrate 202 may both increase the mechanical robustness of the piezoelectric material during fabrication of the SAW resonator and increase manufacturing yield, as well as reduce the amount by which operating parameters of the SAW resonator change with temperature during operation.

An interdigital transducer (IDT) 208 is disposed on top of the layer of piezoelectric material 206, and is configured to generate a surface acoustic wave in the multilayer piezoelectric substrate. In use, the IDT 208 excites a main acoustic wave having a wavelength λ along a surface of the multilayer piezoelectric substrate. The acoustic wave is concentrated in the top two layers (the layer of dielectric material 204 and layer of piezoelectric material 206). The carrier substrate 202 (in this case silicon) may have a high impedance meaning the acoustic wave is reflected at the boundary between the carrier substrate 202 and the layer of dielectric material 204, confining the surface acoustic wave in the top two layers. In some embodiments, the thickness of the layer of dielectric material 204 may be between 0.1λ and 1λ, and the thickness of the layer of piezoelectric material 206 may be between 0.1λ and 1λ.

Any type of IDT may be used as the IDT 208 in the SAW resonator 200. For example, a typical IDT will include a pair of interlocking comb shaped electrodes. Each electrode of the IDT typically includes a bus bar electrode **208*a* and a plurality of electrode fingers 208*b* that extend perpendicularly from the bus bar electrode 208*a*. Typically the distance between the central point of each adjacent electrode finger 208*b* extending from the same bus bar electrode 208*a* is equal to the wavelength λ of the surface acoustic wave generated. The bus bar electrodes 208*a* of each of the pair or IDT electrodes are parallel and opposing each other, and the plurality of electrode fingers 208*b* of each IDT electrode extend towards to the bus bar electrode 208*a* of the opposing electrode, such that the electrode fingers 208*b* interlock, typically with a distance of λ/2 between the center of each adjacent electrode finger 208*b* extending from opposite bus bar electrodes 208*a*. The main surface acoustic wave generated by the IDT travels perpendicular to the lengthwise direction of the IDT electrodes fingers 208*b*, and parallel to the lengthwise direction of the IDT bus bar electrodes 208*a*. The IDT will typically also include input/output terminals 208*c***.

Other types of IDT may be used, as would be understood by the skilled person, for example double electrode IDTs, or IDTs that include additional dummy electrodes may be used. In general the IDT may be formed out of various conductive materials. For example, the IDT may contain at least one of aluminum, titanium, chromium, molybdenum, tungsten, copper, gold, silver, platinum, ruthenium, and iridium. In some embodiments the SAW resonator may include a buffer layer or temperature compensation layer disposed on an upper surface of the IDT electrodes and layer of piezoelectric material 206, to form a temperature-compensated SAW device, or TCSAW. The temperature compensation layer may be made from silicon dioxide, however, a number of other dielectric materials may be used having a temperature compensation property, for example, tellurium dioxide or aluminum nitride.

Figures 1A, 1B:
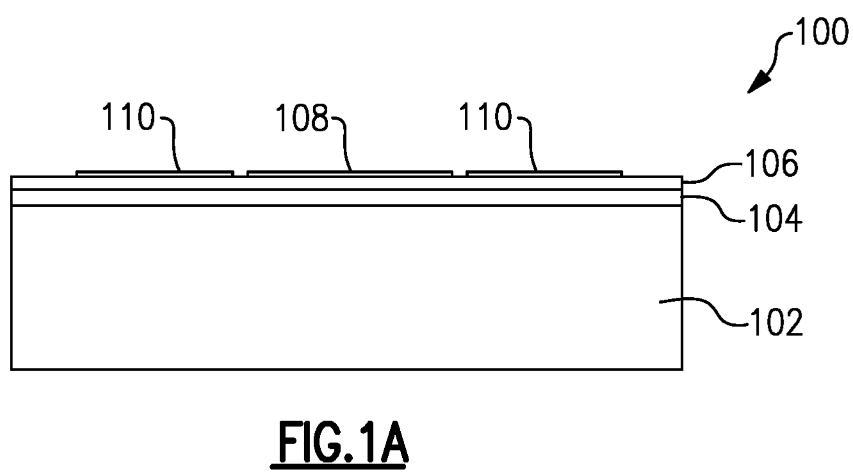
FIG. 1A is a cross-sectional view of an exemplary conventional SAW resonator.
FIG. 1B is a plan view of an exemplary conventional SAW resonator.
Figure 1C:
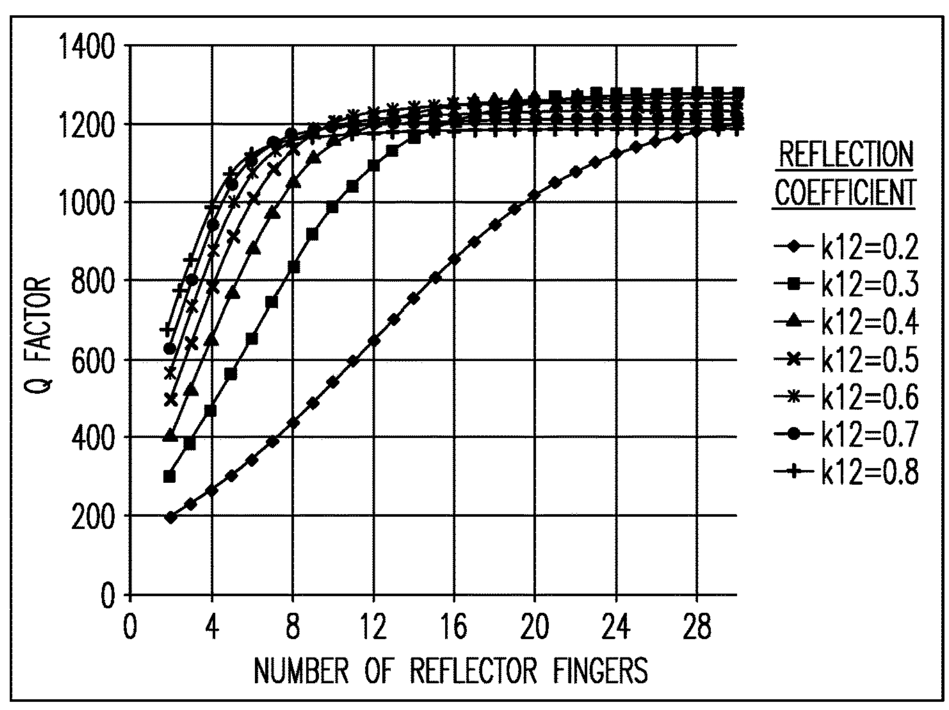
FIG. 1C is a graph showing the relationship between the number of reflector fingers and quality factor for an exemplary conventional SAW resonator such as that in FIGS. 1A and 1B.

In a conventional SAW resonator, the resonator includes one or more reflector gratings, such as the reflector gratings 110 in FIG. 1B. However, to allow miniaturization of the device, these reflection gratings are omitted in the present embodiment. Instead, the layer of dielectric material 204, and layer of piezoelectric material 206 include a pair of opposing terminating edges 250. In the present embodiment, the layer of dielectric material 204 and layer of piezoelectric material 206 overlap fully when seen from a plan view. The layer of dielectric material 204 and layer of piezoelectric material 206 have the same perimeter. The opposing terminated edges 250 therefore form a shared substantially coterminous edge of the layer of dielectric material 204 and layer of piezoelectric material 206.

The IDT 208 is positioned on the surface of the layer of piezoelectric material 206 between the opposing terminating edges 250, with the opposing terminating edges 250 extending perpendicular to the direction of propagation of the main surface acoustic wave generated by the IDT 208. An edge electrode finger **208*b* on each side of the IDT 208 is positioned adjacent to a respective one of the opposing terminating edges 250 of the layer of piezoelectric material 206 and layer of dielectric material 204. The opposing terminating edges 250 may run parallel to the edge electrode fingers 208*b* on either side of the IDT 208**.

The spacing between the edge electrode fingers **208*b* on either side of the IDT 208 and the respective adjacent terminating edge 250 is λ/8 in the present exemplary embodiment, where λ is the wavelength of the surface acoustic wave generated by the interdigital transducer during operation. The distance of λ/8 mentioned above is measured between the terminating edge 250 and the outer edge of the edge electrode finger 208*b*. The layer of piezo electric material 206 extends by a distance of λ/8 beyond the edge of the IDT 208. This distance is chosen to provide the correct edge reflection by the opposing terminating edges 250** to allow proper functioning of the SAW resonator (by allowing constructive interference). Alternative spacings could be used to produce suitable edge reflections, depending on the type of IDT, for example, as would be understood by the skilled person. The example spacings given here are not intended to be limiting. The spacings may be tuned to obtain improved electrical characteristics suitable for the required filter specification and performance.

The opposing terminating edges 250 perform the role of the reflector gratings 110 of the conventional SAW device of FIG. 1B. The opposing terminating edges 250 of the layer of dielectric material 204 and layer of piezoelectric material 206 reflect the surface acoustic wave produced by the IDT 208, to confine the surface acoustic wave within the SAW resonator 200, and in particular within the layer of dielectric material 204 and layer of piezoelectric material 206. The reflection of the surface acoustic wave is a result of the ambient air surrounding the opposing terminating edges 250 having an infinite impedance for the surface acoustic wave, meaning when the acoustic wave reaches the opposing terminating edges 250 it cannot propagate further, and is instead reflected. The same could be achieved by positioning a material with a high impedance by the opposing terminating edges 250, as will be discussed further below.

The opposing terminating edges 250 may be formed through various means. Etching, for example, chemical etching, is one method for forming the opposing terminating edges 250. However, other methods such as mechanical dicing or laser dicing may also be used. Etching may result in a higher precision edge with more desirable taper properties. Typically a 90 degree taper angle is best for providing reflections from the opposing terminating edges 250. However taper angles between 45 degrees and 90 degrees are acceptable, with taper angles greater than 60 degrees preferred.

Figure 2C:
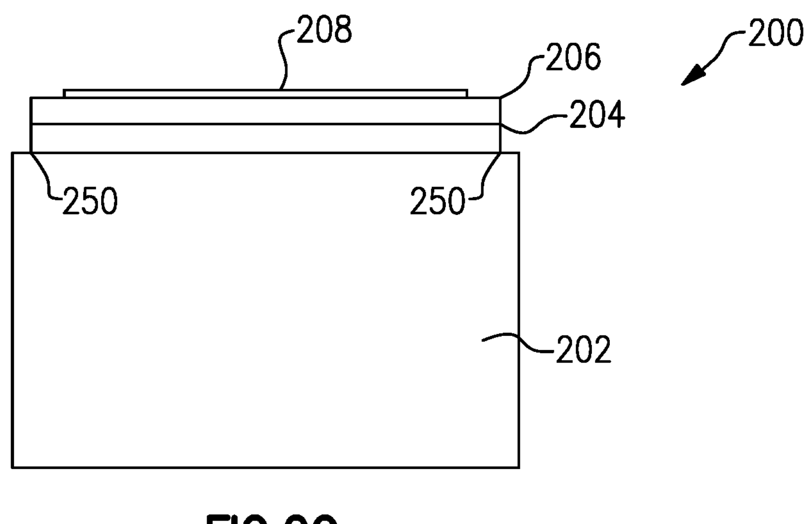
FIG. 2C is a cross-sectional view of an acoustic wave resonator according to aspects of the present invention.
Figure 2D:
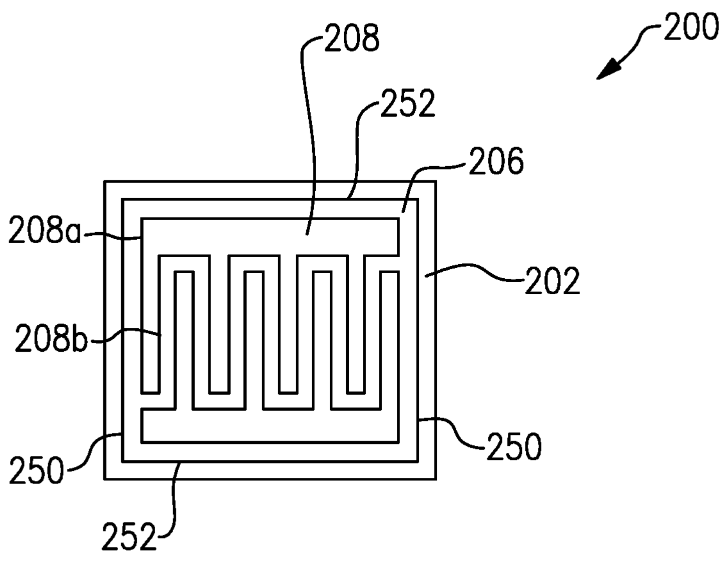
FIG. 2D is a plan view of an acoustic wave resonator according to aspects of the present invention.

In some embodiments, the carrier substrate 202 may also be etched or diced to produce a miniaturized device as shown in the cross-sectional view and plan view of the SAW resonator 200 in FIGS. 2C and 2D, respectively. In FIG. 2D the IDT input/output terminals 208*c* have been omitted for simplicity, however these may be included and appropriately located, as would be understood by the skilled person. In the embodiment shown in FIGS. 2C and 2D the carrier substrate extends slightly past the opposing terminating edges 250 of the layer of dielectric material 204 and layer of piezoelectric material 206 to form a shoulder section. Through this configuration, contact with the layer of piezoelectric material can be prevented during packaging of the SAW device. With conventional devices it is easy to damage the piezoelectric layer through contact during any packaging steps. The shoulder section can therefore prevent any damage occurring during packaging of the SAW device.

By etching, or otherwise forming, the opposing terminating edges 250 in the layer of dielectric material 204 and layer of piezoelectric material 206 directly next to the edge electrode fingers of the IDT 208, the overall footprint of the SAW resonator 200 can be reduced. The carrier substrate 202 may also be etched or diced as explained above to reduce the size of the device. In the embodiments of FIGS. 2A to 2D the footprint of the resonator or the size of the device is reduced in width by twice the width of a conventional reflector grating such as the reflector grating 110 of FIG. 1B, however the performance of the device remains comparable to conventional SAW resonators, as will be shown in more detail later through simulation results.

In some embodiments, the carrier substrate 202 may be etched or diced flush (coterminous) with the opposing terminating edges 250 in the layer of dielectric material 204 and layer of piezoelectric material 206. This provides maximal size reduction of the SAW resonator 200.

In some embodiments, as well as the opposing terminating edges 250 adjacent to the edge electrode fingers 208*b* on either side of the IDT 208, the layer of dielectric material 204 and layer of piezoelectric material 206 may also be etched or diced to form a second pair of opposing terminating edges 252 which run parallel to the bus bar electrodes 208*a* of the IDT. Each of the second pair of opposing terminating edges 252 is positioned adjacent to a respective bus bar from a pair of opposing bus bars included in the IDT 208. Therefore, as shown in FIGS. 2B and 2D, the layer of dielectric material 204 and layer of piezoelectric material 206 may be etched or diced so as to form a boundary the entire way around the IDT 208. Forming the second pair of opposing terminating edges 252 directly adjacent to the bus bar electrodes 208*a* of the IDT 208 can help further miniaturize the device. The carrier substrate may also be diced or etched so it is flush, or extends slightly beyond, the second pair of opposing terminating edges 252.

Although the embodiments of FIGS. 2A to 2D have been described with only one IDT disposed on the multilayer piezoelectric substrate, as would be understood by the skilled person other configurations are possible. For example, a two port SAW resonator configuration is possible, with two IDTs included between the opposing terminating edges 250. Any number of IDTs could be positioned between the opposing terminating edges 250 of the present embodiment as desired.

It should be appreciated that the surface acoustic wave resonators 200 illustrated in FIGS. 2A to 2D, as well as the other circuit elements illustrated in other figures presented herein, are illustrated in a highly simplified form. The relative dimensions of the different features are not shown to scale. Further, typical surface acoustic wave resonators would commonly include a far greater number of electrode fingers in the IDTs than illustrated. Similarly, the number of reflector fingers shown in FIGS. 1A, 1B, and FIGS. 3A to 3D (described below) are not intended to be representative of the number of reflector fingers included within the reflector gratings, which is instead described in the text of the description.

FIGS. 3A to 3D show cross-sectional views and plan views of SAW resonator devices of an alternative embodiment of the present invention. The SAW resonator 300 includes many of the same components as the SAW resonators 200 of FIGS. 2A to 2D. For example, the SAW resonator 300 includes a carrier substrate 302, a layer of dielectric material 304, a layer of piezoelectric material 306, an IDT 308 with bus bar electrodes 308*a*, electrode fingers 308*b* and input/output terminals 308*c*. The coterminous layer of dielectric material 304 and layer of piezoelectric material 306 share a pair of opposing terminating edges 350 and a second pair of opposing terminating edges 352. A repeat of the description of these elements will be omitted, however, the description relating to the previous embodiment remains applicable to the present embodiment. In the embodiment shown in FIGS. 3C and 3D the carrier substrate 302 has been etched or diced so that it is flush (coterminous) with the opposing terminating edges 350 and a second opposing terminating edges 352 of the layer of dielectric material 304 and layer of piezoelectric material 306.

The embodiments of FIGS. 3A to 3D differ from the previous embodiments in that the SAW resonator 300 includes a pair of reflector gratings 310. Although reflector gratings were omitted in the previous embodiment, and replaced with reflections from the terminating edges, in some circumstances reflector gratings may remain desirable. In particular, the spacing (also referred to as the pitch) between the edge of the IDT, in particular the edge electrode finger, and the reflecting body, whether that is a reflector grating or a terminating edge, should be carefully controlled to produce the correct acoustic wave characteristics for the longitude mode. It can be difficult to control this spacing when using etching or dicing to create the opposing terminating edges directly adjacent to the IDT to provide the reflection alone. In this embodiment, reflector gratings 310 are therefore retained in the SAW resonator 300 so that the pitch may be accurately controlled. However, as will be discussed below, the reflector gratings 310 are used in combination with opposing terminating edges 350 to still provide a smaller device compared to a conventional SAW resonator such as that shown in FIGS. 1A and 1B.

The reflector gratings 310 each include a pair of reflector bus bars 310*a*, and a plurality of reflector fingers 310*b* extending between and electrically coupling the pair of reflector bus bars 310*a*. In alternate embodiments, the reflector bus bars 310*a* may be omitted and the reflector fingers 310*b* may be electrically unconnected. The center of each adjacent pair of reflector fingers 310*b* is typically separated by a distance of λ/2, where λ is the wavelength of the surface acoustic wave generated by the interdigital transducer during operation. The reflector gratings 310 may be formed out of various conductive materials. For example, the reflector gratings 310 may contain at least one of aluminum, titanium, chromium, molybdenum, tungsten, copper, gold, silver, platinum, ruthenium, or iridium. The reflector gratings 310 may be formed out of the same material or materials as the IDT 308, or out of different materials.

The pair of reflector gratings 310 are disposed on the layer of piezoelectric material 306 such that the reflector gratings oppose each other with the IDT 308 disposed therebetween, and the plurality of reflector fingers 310*b* extending perpendicular to the direction of propagation of a main surface acoustic wave generated by the IDT 308 when in use. The pair of reflector gratings 310 and the IDT 308 are positioned between the opposing terminating edges 350, with the opposing terminating edges 350 extending perpendicular to the direction of propagation of the surface acoustic wave. A first edge reflector finger 310*b* on each of the reflector gratings 310 is positioned adjacent to an edge electrode finger 308*b* of the IDT 308, and a second edge reflector finger 310*b* on each of the reflector gratings 310 is positioned adjacent to a respective one of the opposing terminating edges 350 of the layer of piezoelectric material 306 and layer of dielectric material 304.

Figure 1D:
FIG. 1D is a graph showing the minimum number of reflector fingers required at different reflection coefficients for an exemplary conventional SAW resonator such as that in FIGS. 1A and 1B.

Unlike conventional SAW resonators, which typically include 10 to 15 or more reflector fingers in each of the reflector gratings, the reflector gratings 310 in the present embodiment each include less than eight reflector fingers 310*b*. As discussed in relation to FIG. 1D, this is less than the minimum number of reflector fingers required for conventional SAW resonator devices, and therefore allows reduction in size of the SAW resonator. Preferably, the number of reflector fingers 310*b* is equal to or less than five, to provide further size reduction of the SAW resonator.

Having such a relatively small number of reflector fingers 310*b* can affect the reflection performance of the reflector gratings 310. However, in the present embodiment, the reflector gratings 310 act in combination with the opposing terminating edges 350, with both sandwiching the IDT 308 to reflect the main acoustic wave back and forth through the IDT 308. In this way, the high precision reflector gratings 310 allow the spacing (pitch) between the IDT 308 and the first edge reflector finger 310*b* adjacent to the IDT 308 to be accurately controlled, while the edge reflections caused by the opposing termination edges 350, which can be etched or diced to a medium precision, reinforce the reflection of the acoustic wave allowing the SAW device to still operate correctly with the reduced number of reflector fingers 310*b*. Therefore, the width of the reflector gratings and thus the width of the SAW resonator as a whole can be reduced, without detrimentally affecting the performance of device, and while still accurately controlling the pitch. A discussion of the performance of the embodiments discussed so far will be made in relation to FIGS. 4A to 4C later.

The spacing between the first edge reflector finger 310*b* on each of the reflector gratings 310 and the respective edge electrode finger 308*b* of the IDT 308 is λ/8 in the present exemplary embodiment, where λ is the wavelength of the surface acoustic wave generated by the interdigital transducer during operation. The width of piezoelectric material between each reflector grating 310 and the IDT (the spacing or pitch referred to above) is λ/8. The spacing between the second edge reflector finger 310*b* on each of the reflector gratings 310 and the respective terminating edge 350 is also λ/8 in the present embodiment. The layer of piezoelectric material 306 extends by a distance of λ/8 beyond the edge of the reflector gratings 310. These distances are chosen to provide the correct reflections by the reflector gratings 310 and opposing terminating edges 350 to allow proper functioning of the SAW resonator (by allowing constructive interference). Alternative spacings could be used to produce suitable edge reflections, depending on the type of IDT, for example, as would be understood by the skilled person. The example spacings given here are not intended to be limiting. The spacings could be tuned to obtain improved electrical characteristics suitable for the desired filter specification and performance.

Although the embodiments of FIGS. 3A to 3D have been described with only one IDT disposed on the multilayer piezoelectric substrate, as would be understood by the skilled person other configurations are possible. For example, a two port SAW resonator configuration is possible, with two IDTs included between the reflector gratings 310 and opposing terminating edges 350. Any number of IDTs could be positioned between the reflector gratings 310 and opposing terminating edges 350 of the present embodiment as desired.

In all of the embodiments disclosed thus far, etching or dicing the layer of dielectric material and layer of piezoelectric material as described above allows either all reflector fingers or numerous pairs of reflector fingers to be removed, enabling miniaturization of the SAW device while maintaining an acceptable performance level. Based on a conventional SAW resonator with reflector fingers, a size reduction of 15λ, can be achieved when the reflector gratings are removed in their entirety, and a size reduction of, for example, 10λ, can be achieved when the number of reflector fingers is reduced to five while still maintaining high precision control of the IDT-reflector grating separation.

Moreover, etching the multilayer piezoelectric substrate as described above can reduce the complexity of packaging of the SAW devices. The thin layer of piezoelectric material 206,306 is often very fragile and susceptible to damage from mechanical stress. Damage to the piezoelectric layer due to mechanical stress from the packaging structure can be avoided by etching away the piezoelectric material located away from the IDT toward the edge of the die, for example, by removing the piezoelectric material located beyond the opposing terminating edges 250, 350. Due to the opposing terminating edges 250, 350 the removed piezoelectric material is not needed for the acoustic function of the resonator. Aspects and embodiments disclosed herein therefore allow for fragile piezoelectric material that is susceptible to damage during packaging to be removed from the extremities of the die.

Figure 4A:
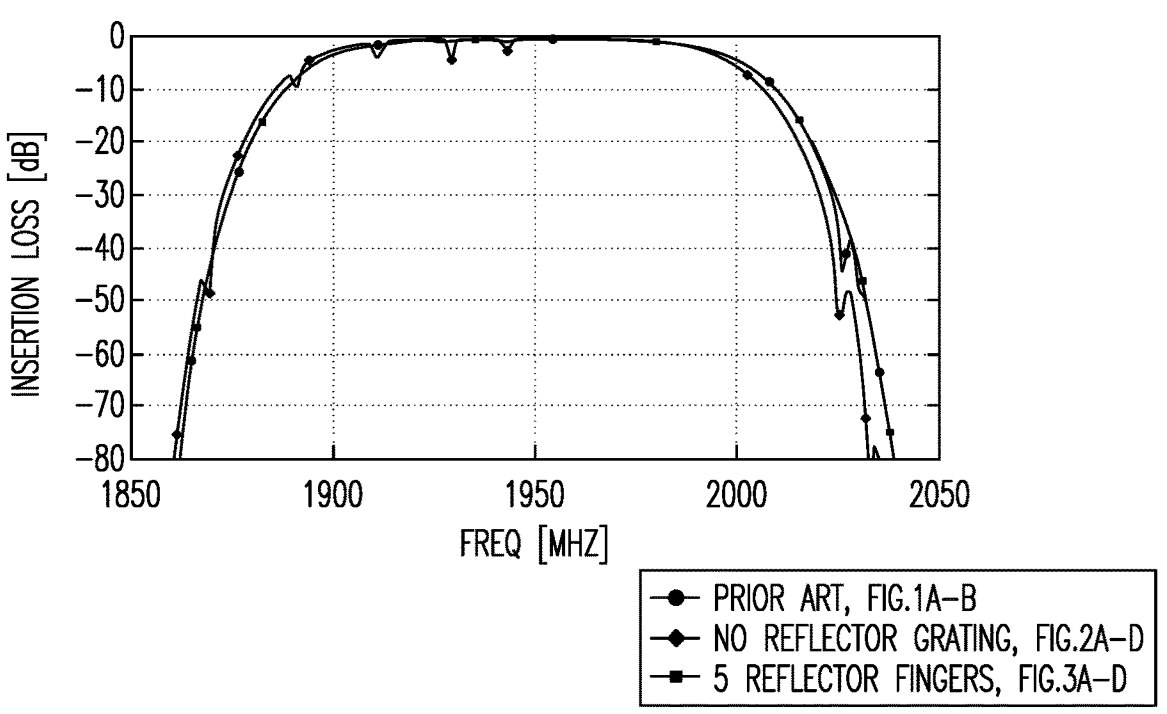
FIG. 4A is a graph showing the frequency response of parameters of acoustic wave resonators according to aspects of the present invention.
Figure 4B:
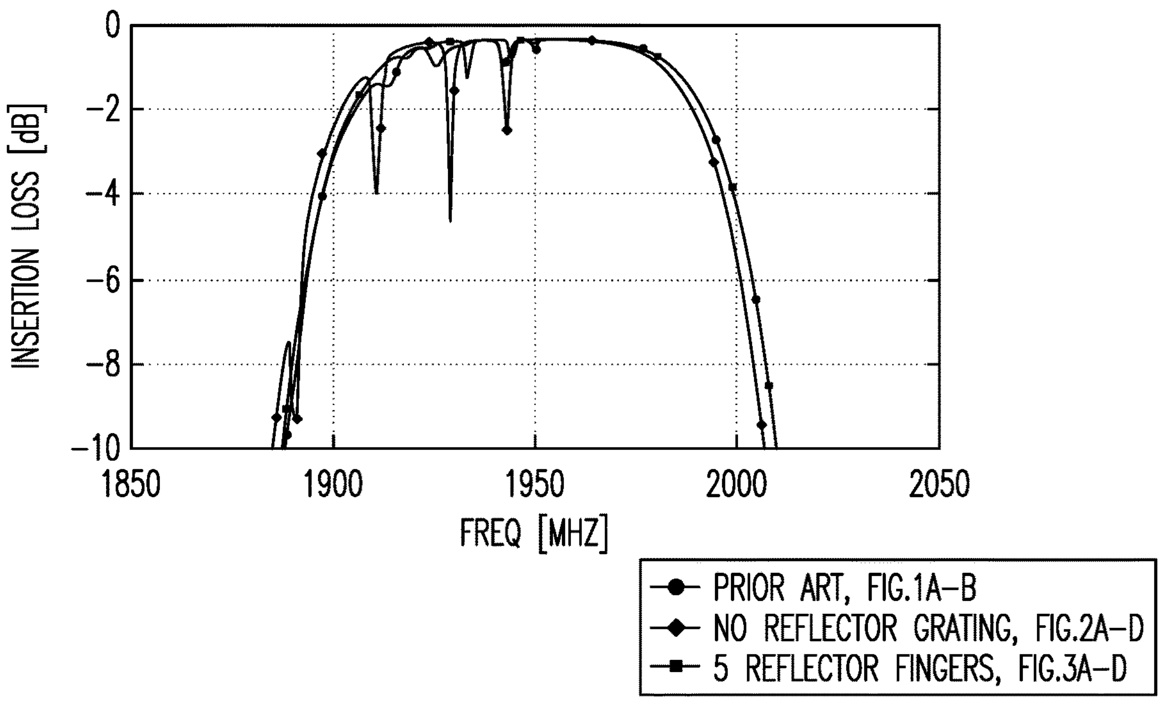
FIG. 4B is a graph showing the frequency response of parameters of acoustic wave resonators according to aspects of the present invention.
Figure 4C:
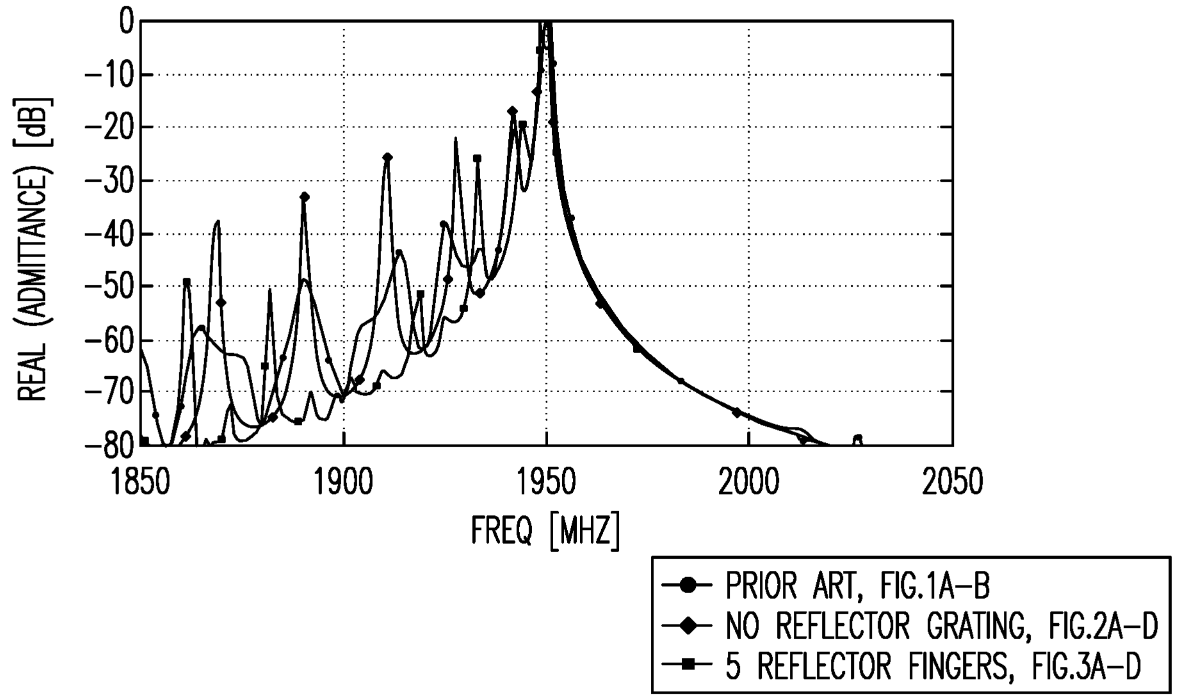
FIG. 4C is a graph showing the frequency response of parameters of acoustic wave resonators according to aspects of the present invention.

FIGS. 4A to 4C show the results of simulations of operating parameters of the SAW resonators 200, 300 described above. The s-parameters of the SAW resonators were calculated using a finite element method (FEM), and the performance of a simple ladder filter was calculated by a circuit simulator.

Each of FIGS. 4A to 4C show the simulation results for a conventional SAW resonator such as that described in FIGS. 1A and 1B, for a SAW resonator 200 without any reflector gratings, such as that shown in FIGS. 2A to 2D, and for a SAW resonator 300 with reflector gratings 310 with less than eight reflector fingers 310*b*, such as that shown in FIGS. 3A to 3D, with five fingers being used in the SAW resonator 300 in this case. In each case the IDT had 150 electrode fingers.

FIG. 4A shows the insertion loss plot for the ladder filter, with FIG. 4B showing the same data but with a smaller data range on the y-axis. FIG. 4C shows the real part of the admittance of the resonators.

As can be seen from FIGS. 4A to 4C, the miniaturized SAW resonator configurations described in FIGS. 2A to 2D and FIGS. 3A to 3D provide comparable performance to a conventional SAW resonator device. The embodiment of FIGS. 3A to 3D including less than eight reflector fingers (in this case five reflector fingers) is particularly comparable with the larger conventional SAW device. The edge reflections due to the opposing terminating edges 250, 350 prevent significant deterioration of the performance of the SAW resonator, despite the reduction in size due to the removal of reflector fingers.

Next a method of manufacture of a SAW resonator in accordance with embodiments of the present invention will be described in relation to FIGS. 5A to 5D.

Figures 5A, 5B, 5C, 5D:
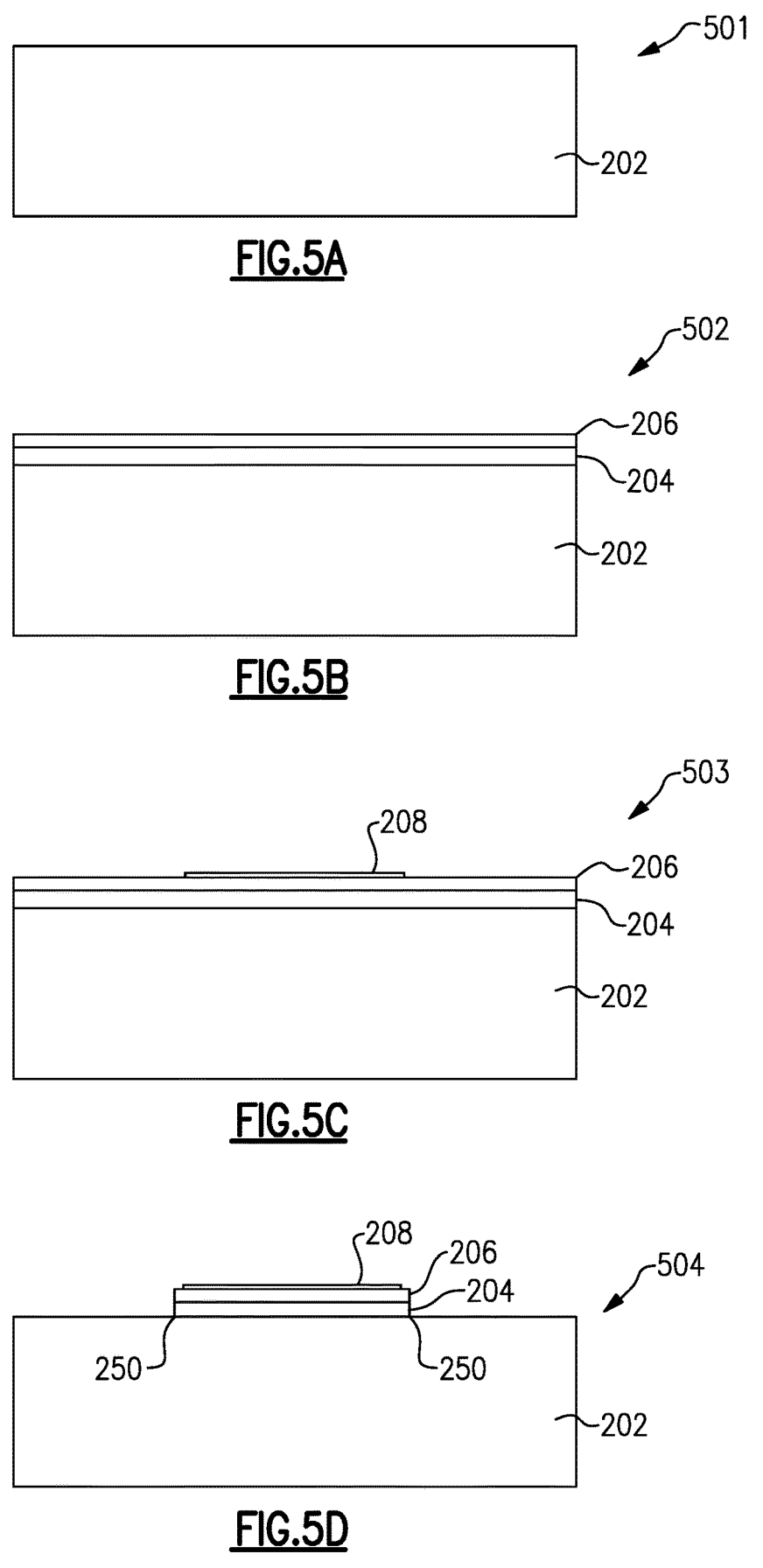

In step 501 shown in FIG. 5A a carrier substrate 202 is provided. The substrate may be a silicon wafer, for example.

In step 502 shown in FIG. 5B a layer of dielectric material 204 is disposed on an upper surface of the carrier substrate 202, and a layer of piezoelectric material 206 is disposed above the layer of dielectric material 204 on the upper surface of the carrier substrate 202.

In some embodiments, to perform step 502 a wafer of piezoelectric material may be provided. A layer of dielectric material, for example, silicon dioxide, may be grown or deposited on both the lower surface of the wafer of piezoelectric material and the upper surface of the carrier substrate wafer. The layer of dielectric material 204 may then act as a bonding agent between the carrier substrate 202 and the wafer of piezoelectric material 206. For example, the wafer of piezoelectric material and carrier substrate may be joined by anodic bonding or other methods of joining layers of, for example, silicon dioxide, to form the layer of dielectric material 204. If necessary, the wafer of piezoelectric material may be thinned after bonding by grinding or the like to produce the thin layer of piezoelectric material 206.

In step 503 shown in FIG. 5C the IDT 208 is fabricated. This fabrication involves disposing an IDT on the layer of piezoelectric material. In the case of the embodiment shown in FIGS. 3A to 3D above, step 503 can also include disposing a pair of reflector gratings that oppose each other with the IDT disposed therebetween, each reflector grating including less than eight reflector fingers, for example, equal to or less than five reflector fingers.

Various fabrication methods as known in the art could be used to form the IDT 208. For example, the IDT 208 may be formed through one or more of mask printing, laser etching, dry etching, vapor phase etching, deposition such as physical vapor deposition, electroplating, a lift-off process, or the like. Reflector gratings may be formed through similar methods.

In step 504 shown in FIG. 5D etching or dicing of the layer of dielectric material 204 and layer of piezoelectric material 206 is performed. The etching or dicing of the layer of dielectric material 204 and layer of piezoelectric material 206 forms the pair of opposing terminating edges 250 adjacent to respective edge electrode fingers included in the IDT 208 that extend perpendicular to the direction of propagation of a surface acoustic wave to be generated by the IDT. The pair of opposing terminating edges 250 are shared by the layer of dielectric material 204 and layer of piezoelectric material 206. In other words the layer of dielectric material 204 and layer of piezoelectric material 206 are substantially coterminous. In the case of the embodiment shown in FIGS. 3A to 3D above, the opposing terminating edges 250 would be etched or diced adjacent to a respective reflector grating 310.

The opposing terminating edges 250 may be formed through various means. Etching, for example, chemical etching, is one method for forming the opposing terminating edges 250, however, mechanical dicing or laser dicing may also be used.

In some embodiments, the carrier substrate 202 may also be diced or etched, either with the layer of dielectric material 204 and layer of piezoelectric material 206, or after the etching/dicing of the layer of dielectric material 204 and layer of piezoelectric material 206. In some embodiments, the carrier substrate 202 may be diced or etched so that it is coterminous with the opposing terminating edges 250 of the layer of dielectric material 204 and layer of piezoelectric material 206. In other embodiments, the carrier substrate 202 may extend beyond the opposing terminating edges 250 of the layer of dielectric material 204 and layer of piezoelectric material 206, so that a shoulder is formed.

In some embodiments, the SAW resonator may be appropriately packaged either after the method steps outlined above have been completed, or during part of a process including the method steps outlined above.

By manufacturing a SAW resonator using the method described above, including etching, dicing or otherwise forming the opposing terminating edges 250, 350 in the layer of dielectric material and layer of piezoelectric material directly next to the edge electrode fingers of the IDT 208 or the edge reflector fingers in the reflector gratings 310, the overall footprint of the SAW resonator can be reduced, producing a downsized device.

In the previous described embodiments, the opposing terminating edges 250, 350 form a boundary between the layers of dielectric and piezoelectric materials and the ambient air. The ambient air surrounding the opposing terminating edges 250, 350 has an infinite impedance for the surface acoustic wave, meaning when the acoustic wave reaches the opposing terminating edges 250, 350 it cannot propagate further, and is instead reflected. However, in alternative embodiments, a material of high impedance (meaning a material with a high acoustic impedance such that acoustic waves cannot readily propagate through the material) may instead be disposed against the opposing terminating edges 250, 350 to reflect the surface acoustic wave.

Figure 3A:
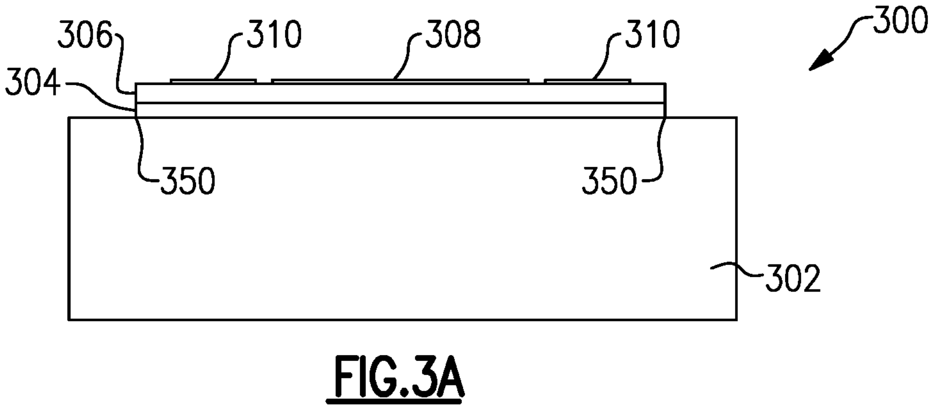
FIG. 3A is a cross-sectional view of an acoustic wave resonator according to aspects of the present invention.
Figure 3B:
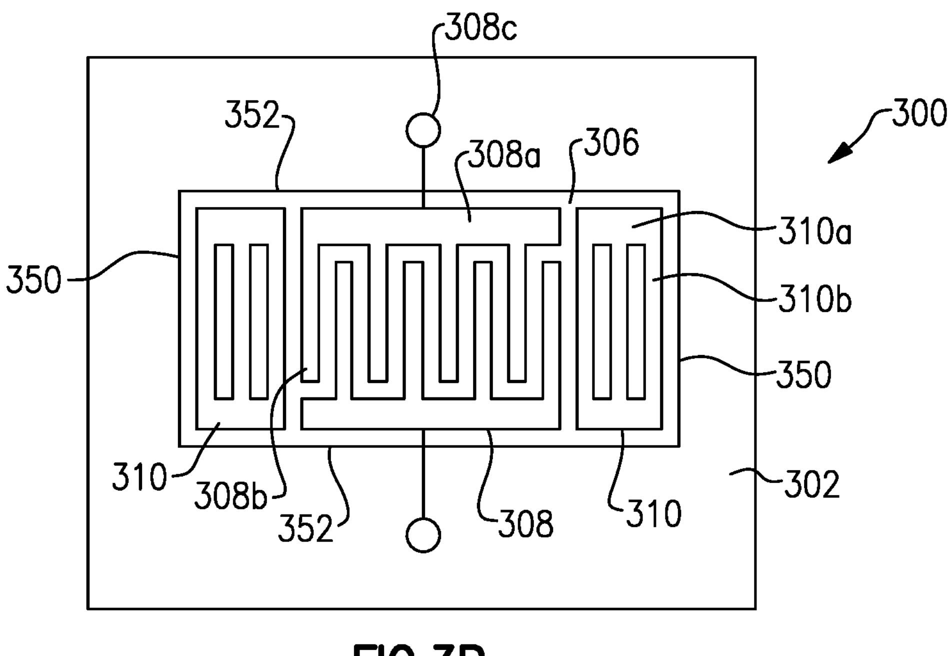
FIG. 3B is a plan view of an acoustic wave resonator according to aspects of the present invention.
Figure 3C:
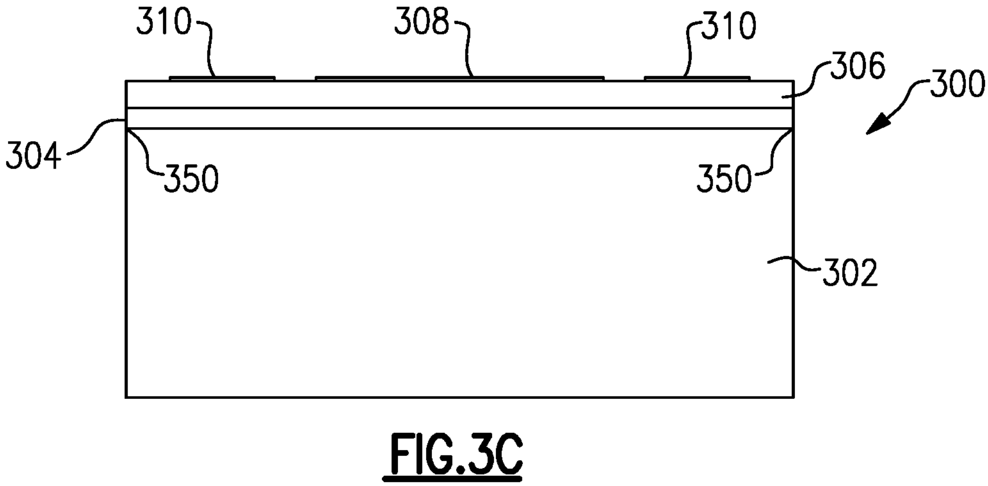
FIG. 3C is a cross-sectional view of an acoustic wave resonator according to aspects of the present invention.
Figure 3D:
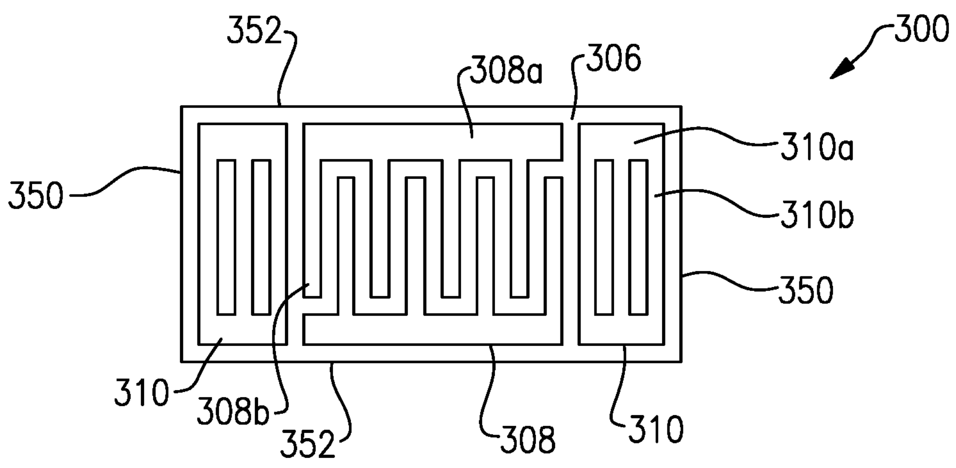
FIG. 3D is a plan view of an acoustic wave resonator according to aspects of the present invention.
Figure 6:
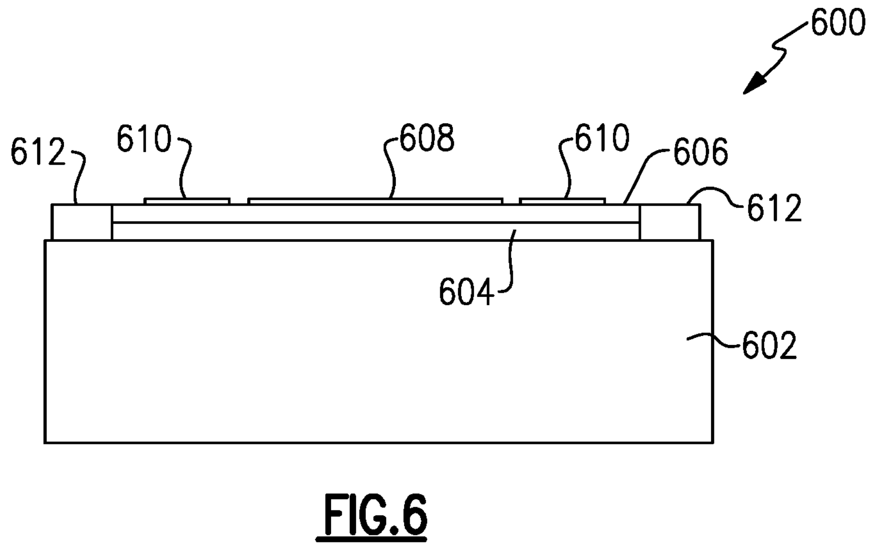
FIG. 6 is a cross-sectional view of an acoustic wave resonator according to aspects of the present invention.

For example, FIG. 6 shows a SAW resonator 600 that is identical to the SAW resonator of FIG. 3A, except that the SAW resonator 600 of FIG. 6 includes a high impedance portions 612 disposed against the opposing terminating edges 250. The high impedance portions 612 may be formed from any high impedance material, meaning a material with a high acoustic impedance such that acoustic waves cannot readily propagate through the material. Examples include but are not limited to silicon nitride (SiN), silicon (Si), diamond, aluminum nitride, magnesium oxide spinel, magnesium oxide crystal, quartz, DLC (diamond-like carbon), and sapphire. When the surface acoustic wave propagating through the multilayer piezoelectric substrate reaches the opposing terminating edges 250 it is reflected at the boundary, rather than propagating through the high impedance portions 612. The high impedance portions 612 may be included as part of the packaging of the SAW resonator.

The concepts and embodiments of SAW resonators described herein are applicable to various types of SAW devices, as would be understood by the skilled person. For example, the invention may be applied to filters, duplexers, diplexers or the like, no matter what the acoustic mode is (e.g., Rayleigh or shear horizontal (SH)), and no matter what materials are used in the multilayer piezoelectric substrate, IDT(s) and reflector gratings. The reduction in the size of the above described SAW resonators may allow more devices to be formed per given amount of area in a circuit having a certain number of SAW devices, leading to an overall reduction in size of the circuit.

Figure 7:
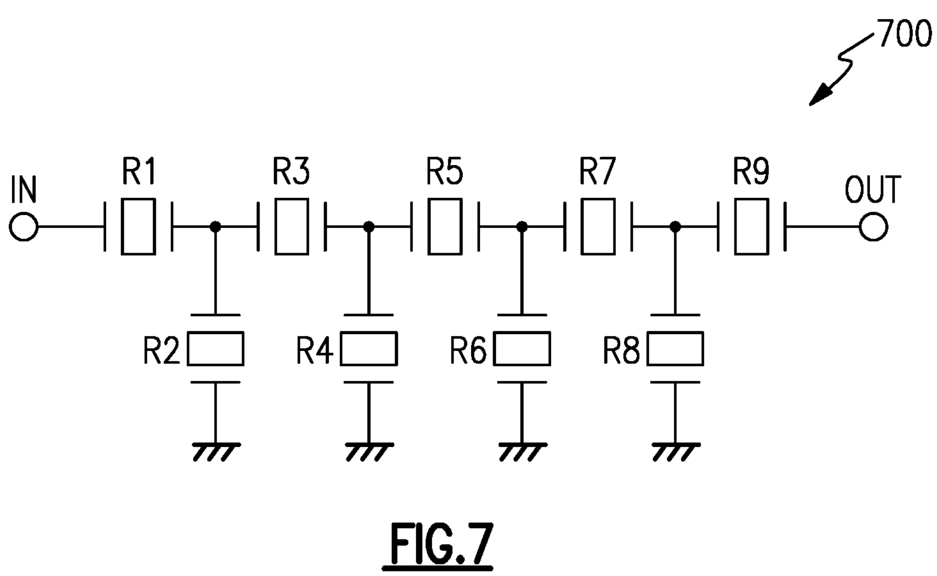
FIG. 7 shows an example of a ladder filter in which multiple acoustic wave resonators according to aspects of the present invention may be combined.

For example, FIG. 7 shows an example of a filter 700 which multiple SAW resonators as disclosed herein may be combined. FIG. 7 shows an RF ladder filter 700 including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 8:
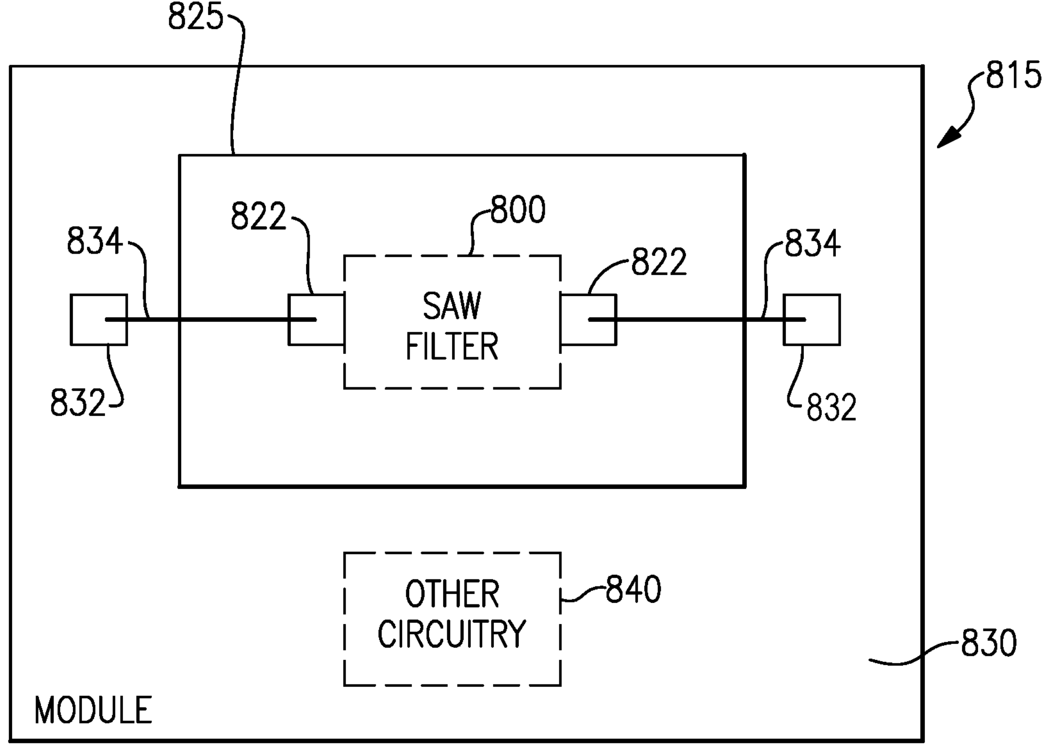
FIG. 8 is a block diagram of one example of a filter module that can include one or more acoustic wave resonators according to aspects of the present disclosure.
Figure 9:
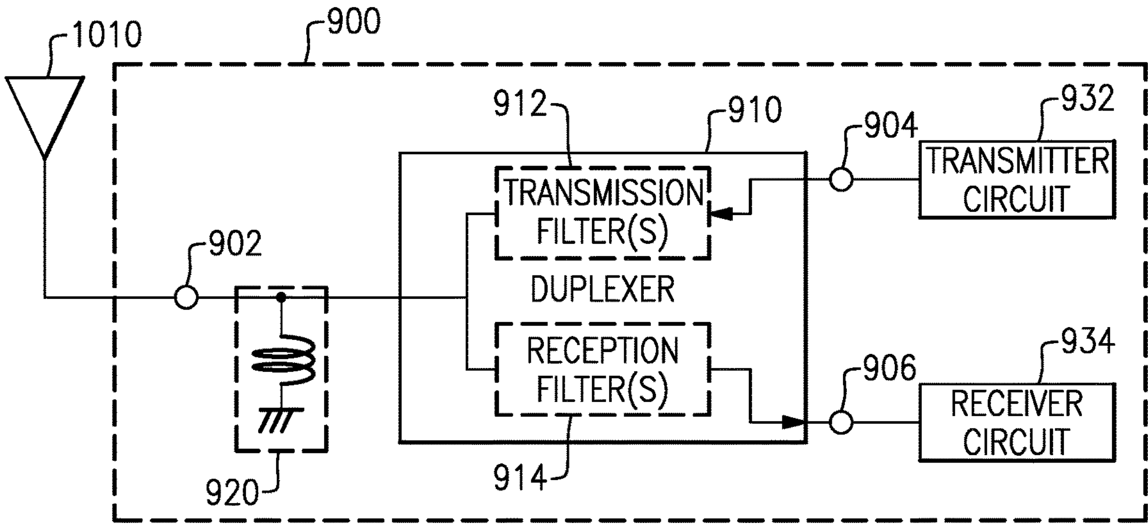
FIG. 9 is a block diagram of one example of a front-end module that can include one or more filter modules including acoustic wave resonators according to aspects of the present disclosure.
Figure 10:
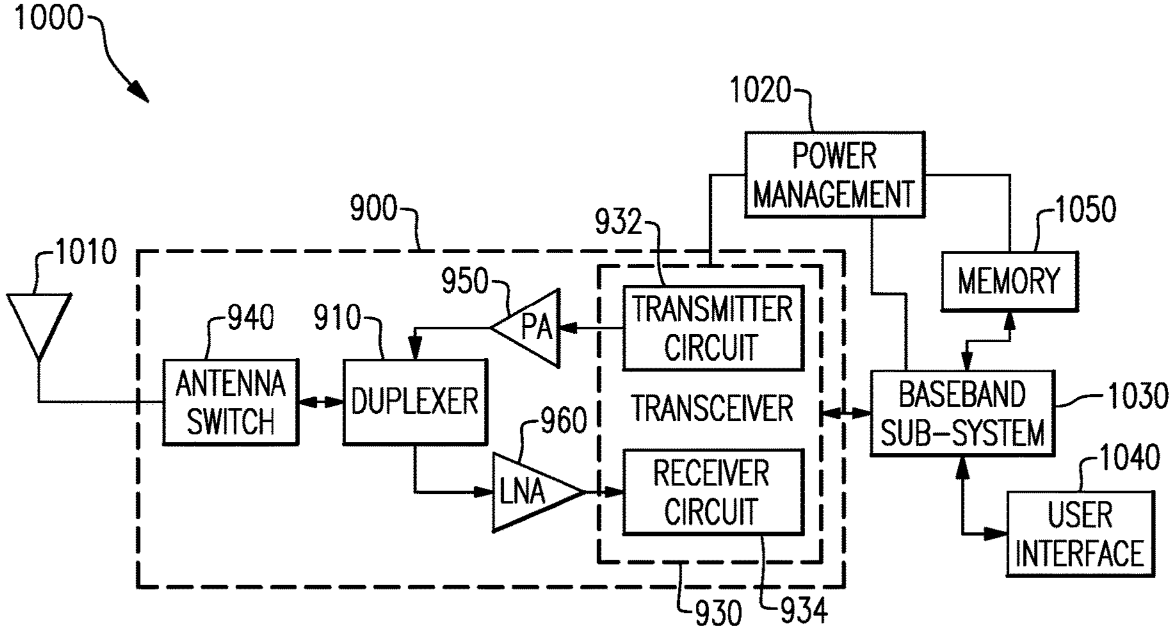
FIG. 10 is a block diagram of one example of a wireless device including the front-end module of FIG. 9.

Moreover, examples an embodiments of SAW resonators discussed herein can be implemented in a variety of packaged modules. Some example packaged modules will now be discussed in which any suitable principles and advantages of the SAW resonators discussed herein can be implemented. FIGS. 8, 9, and 10 are schematic block diagrams of illustrative packaged modules and devices according to certain embodiments.

As discussed above, surface acoustic wave resonators, such as those of FIGS. 2A to 2D, 3A to 3D and 6, can be used in SAW radio frequency (RF) filters. In turn, a SAW RF filter using one or more surface acoustic wave elements, such as the SAW filter of FIG. 7, may be incorporated into and packaged as a module that may ultimately be used in an electronic device, such as a wireless communications device, for example. FIG. 8 is a block diagram illustrating one example of a module 815 including a SAW filter 800. The SAW filter 800 may be implemented on one or more die(s) 825 including one or more connection pads 822. For example, the SAW filter 800 may include a connection pad 822 that corresponds to an input contact for the SAW filter and another connection pad 822 that corresponds to an output contact for the SAW filter. The packaged module 815 includes a packaging substrate 830 that is configured to receive a plurality of components, including the die 825. A plurality of connection pads 832 can be disposed on the packaging substrate 830, and the various connection pads 822 of the SAW filter die 825 can be connected to the connection pads 832 on the packaging substrate 830 via electrical connectors 834, which can be solder bumps or wirebonds, for example, to allow for passing of various signals to and from the SAW filter 800. The module 815 may optionally further include other circuitry die 840, for example, one or more additional filter(s), amplifiers, pre-filters, modulators, demodulators, down converters, and the like, as would be known to one of skill in the art of semiconductor fabrication in view of the disclosure herein. In some embodiments, the module 815 can also include one or more packaging structures to, for example, provide protection and facilitate easier handling of the module 815. Such a packaging structure can include an overmold formed over the packaging substrate 830 and dimensioned to substantially encapsulate the various circuits and components thereon.

Various examples and embodiments of the SAW filter 800 can be used in a wide variety of electronic devices. For example, the SAW filter 800 can be used in an antenna duplexer, which itself can be incorporated into a variety of electronic devices, such as RF front-end modules and communication devices.

Referring to FIG. 9, there is illustrated a block diagram of one example of a front-end module 900, which may be used in an electronic device such as a wireless communications device (e.g., a mobile phone) for example. The front-end module 900 includes an antenna duplexer 910 having a common node 902, an input node 904, and an output node 906. An antenna 1010 is connected to the common node 902.

The antenna duplexer 910 may include one or more transmission filters 912 connected between the input node 904 and the common node 902, and one or more reception filters 914 connected between the common node 902 and the output node 906. The passband(s) of the transmission filter (s) are different from the passband(s) of the reception filters. Examples of the SAW filter 800 can be used to form the transmission filter(s) 912 and/or the reception filter(s) 914. An inductor or other matching component 920 may be connected at the common node 902.

The front-end module 900 further includes a transmitter circuit 932 connected to the input node 904 of the duplexer 910 and a receiver circuit 934 connected to the output node 906 of the duplexer 910. The transmitter circuit 932 can generate signals for transmission via the antenna 1010, and the receiver circuit 934 can receive and process signals received via the antenna 1010. In some embodiments, the receiver and transmitter circuits are implemented as separate components, as shown in FIG. 9, however, in other embodiments these components may be integrated into a common transceiver circuit or module. As will be appreciated by those skilled in the art, the front-end module 900 may include other components that are not illustrated in FIG. 9 including, but not limited to, switches, electromagnetic couplers, amplifiers, processors, and the like.

FIG. 10 is a block diagram of one example of a wireless device 1000 including the antenna duplexer 910 shown in FIG. 9. The wireless device 1000 can be a cellular phone, smart phone, tablet, modem, communication network or any other portable or non-portable device configured for voice or data communication. The wireless device 1000 can receive and transmit signals from the antenna 1010. The wireless device includes an embodiment of a front-end module 900 similar to that discussed above with reference to FIG. 9. The front-end module 900 includes the duplexer 910, as discussed above. In the example shown in FIG. 10 the front-end module 900 further includes an antenna switch 940, which can be configured to switch between different frequency bands or modes, such as transmit and receive modes, for example. In the example illustrated in FIG. 10, the antenna switch 940 is positioned between the duplexer 910 and the antenna 1010; however, in other examples the duplexer 910 can be positioned between the antenna switch 940 and the antenna 1010. In other examples the antenna switch 940 and the duplexer 910 can be integrated into a single component.

The front-end module 900 includes a transceiver 930 that is configured to generate signals for transmission or to process received signals. The transceiver 930 can include the transmitter circuit 932, which can be connected to the input node 904 of the duplexer 910, and the receiver circuit 934, which can be connected to the output node 906 of the duplexer 910, as shown in the example of FIG. 9.

Signals generated for transmission by the transmitter circuit 932 are received by a power amplifier (PA) module 950, which amplifies the generated signals from the transceiver 930. The power amplifier module 950 can include one or more power amplifiers. The power amplifier module 950 can be used to amplify a wide variety of RF or other frequency-band transmission signals. For example, the power amplifier module 950 can receive an enable signal that can be used to pulse the output of the power amplifier to aid in transmitting a wireless local area network (WLAN) signal or any other suitable pulsed signal. The power amplifier module 950 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 950 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 10, the front-end module 900 may further include a low noise amplifier (LNA) module 960, which amplifies received signals from the antenna 1010 and provides the amplified signals to the receiver circuit 934 of the transceiver 930.

The wireless device 1000 of FIG. 10 further includes a power management sub-system 1020 that is connected to the transceiver 930 and manages the power for the operation of the wireless device 1000. The power management system 1020 can also control the operation of a baseband sub-system 1030 and various other components of the wireless device 1000. The power management system 1020 can include, or can be connected to, a battery (not shown) that supplies power for the various components of the wireless device 1000. The power management system 1020 can further include one or more processors or controllers that can control the transmission of signals, for example. In one embodiment, the baseband sub-system 1030 is connected to a user interface 1040 to facilitate various input and output of voice and/or data provided to and received from the user. The baseband sub-system 1030 can also be connected to memory 1050 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 500 MHz to 3 GHz.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An acoustic wave resonator, comprising:

a carrier substrate;

a layer of dielectric material disposed on an upper surface of the carrier substrate;

a layer of piezoelectric material disposed above the layer of dielectric material on the upper surface of the carrier substrate, the layer of piezoelectric material including a pair of opposing terminating edges that are coterminous with the layer of dielectric material;

one or more interdigital transducers disposed on the layer of piezoelectric material, the one or more interdigital transducers being configured to generate an acoustic wave, the one or more interdigital transducers including a pair of opposing edge electrode fingers that extend perpendicular to a direction of propagation of the acoustic wave and that are each positioned adjacent to a respective terminating edge of the layer of piezoelectric material and layer of dielectric material; and a layer of high impedance material disposed against the pair of opposing terminating edges, the layer of high impedance material having a same thickness as a combined thickness of the layers of dielectric material and piezoelectric material at a point of contact between the layer of high impedance material and the layers of dielectric material and piezoelectric material.

2. The acoustic wave resonator of claim 1 wherein the opposing terminating edges each extend parallel to respective ones of the pair of opposing edge electrode fingers of the one or more interdigital transducers.

3. The acoustic wave resonator of claim 1 wherein the pair of opposing terminating edges are configured to reflect the acoustic wave generated by the one or more interdigital transducers.

4. The acoustic wave resonator of claim 1 wherein the carrier substrate is also coterminous with the pair of opposing terminating edges.

5. The acoustic wave resonator of claim 1 wherein the layer of piezoelectric material includes a second pair of opposing terminating edges that are coterminous with the layer of dielectric material.

6. The acoustic wave resonator of claim 5 wherein the second pair of opposing terminating edges are each positioned adjacent to a respective bus bar from opposing bus bars included in the one or more interdigital transducers that extend parallel to the direction of propagation of the acoustic wave generated by the one or more interdigital transducers.

7. The acoustic wave resonator of claim 1 wherein spacing between each edge electrode finger and an adjacent one of the pair of opposing terminating edges is equal to about λ/8, where λ is a wavelength of the acoustic wave generated by the one or more interdigital transducers during operation.

8. The acoustic wave resonator of claim 1 wherein the layer of piezoelectric material and the layer of dielectric material each have a thickness of between about 0.1λ and about 1λ, where λ is a wavelength of the acoustic wave generated by the one or more interdigital transducers during operation.

9. An acoustic wave resonator, comprising:
- a carrier substrate;
- a layer of dielectric material disposed on an upper surface of the carrier substrate;
- a layer of piezoelectric material disposed above the layer of dielectric material on the upper surface of the carrier substrate, the layer of piezoelectric material including a pair of opposing terminating edges that are coterminous with the layer of dielectric material;
- one or more interdigital transducers disposed on the layer of piezoelectric material; and
- a pair of reflector gratings disposed on the layer of piezoelectric material and each including less than eight reflector fingers, the pair of reflector gratings each being positioned adjacent to an adjacent one of the pair of opposing terminating edges of the layer of piezoelectric material such that the reflector gratings oppose each other with the one or more interdigital transducers therebetween, spacing between an edge electrode finger of each of the pair of reflector gratings and the adjacent one of the pair of opposing terminating edges being equal to about λ/8, where λ is a wavelength of an acoustic wave generated by the one or more interdigital transducers during operation.

10. The acoustic wave resonator of claim 9 wherein the pair of reflector gratings each include a number of reflector fingers equal to or less than five.

11. The acoustic wave resonator of claim 9 wherein the pair of opposing terminating edges form a boundary between the layers of dielectric and piezoelectric materials and ambient air.

12. The acoustic wave resonator of claim 9 further comprising a material of high impedance disposed against the pair of opposing terminating edges.

13. The acoustic wave resonator of claim 9 wherein the pair of opposing terminating edges each extend parallel to an edge reflector finger of a respective reflector grating.

14. The acoustic wave resonator of claim 9 wherein the pair of opposing terminating edges are configured to reflect an acoustic wave generated by the one or more interdigital transducers.

15. The acoustic wave resonator of claim 9 wherein the carrier substrate is also coterminous with the pair of opposing terminating edges.

16. The acoustic wave resonator of claim 9 wherein the layer of piezoelectric material includes a second pair of opposing terminating edges that are coterminous with the layer of dielectric material.

17. The acoustic wave resonator of claim 16 wherein the second pair of opposing terminating edges are each positioned adjacent to a respective bus bar from opposing bus bars included in the one or more interdigital transducers that extend parallel to a direction of propagation of the acoustic wave generated by the one or more interdigital transducers.

18. The acoustic wave resonator of claim 9 wherein the spacing between each reflector grating and an edge electrode finger of the one or more interdigital transducers is equal to about λ/8, where λ is the wavelength of the acoustic wave generated by the one or more interdigital transducers during operation.

19. The acoustic wave resonator of claim 9 wherein the layer of piezoelectric material and the layer of dielectric material each have a thickness of between about 0.1λ and about 1λ, λ being the wavelength of the acoustic wave generated by the one or more interdigital transducers during operation.

20. An acoustic wave resonator, comprising:
- a carrier substrate;
- a layer of dielectric material disposed on an upper surface of the carrier substrate;
- a layer of piezoelectric material disposed above the layer of dielectric material on the upper surface of the carrier substrate, the layer of piezoelectric material including a pair of opposing terminating edges that are coterminous with the layer of dielectric material;
- one or more interdigital transducers disposed on the layer of piezoelectric material;
- a pair of reflector gratings disposed on the layer of piezoelectric material and each including less than eight reflector fingers, the pair of reflector gratings each being positioned adjacent to a respective terminating edge of the layer of piezoelectric material and layer of dielectric material such that the reflector gratings oppose each other with the one or more interdigital transducers therebetween; and
- a layer of high impedance material disposed against the opposing terminating edges, the layer of high impedance material having a same thickness as a combined thickness of the layers of dielectric material and piezoelectric material at a point of contact between the layer of high impedance material and the layers of dielectric material and piezoelectric material.

* * * * *